United States Patent [19]

Nemoto et al.

[11] Patent Number: 5,410,005
[45] Date of Patent: Apr. 25, 1995

[54] REFLECTION PREVENTING FILM AND PROCESS FOR FORMING RESIST PATTERN USING THE SAME

[75] Inventors: Hiroaki Nemoto, Yokkaichi; Takayoshi Tanabe, Toyama; Yoshiji Yumoto; Takao Miura, both of Yokkaichi, all of Japan

[73] Assignee: Japan Synthetic Rubber Co., Ltd., Tokyo, Japan

[21] Appl. No.: 105,622

[22] Filed: Aug. 13, 1993

[30] Foreign Application Priority Data

Aug. 14, 1992 [JP] Japan ................... 4-237575

[51] Int. Cl.$^6$ ............................ C08F 18/20
[52] U.S. Cl. ............................ 526/245
[58] Field of Search ...................... 526/245

[56] References Cited

FOREIGN PATENT DOCUMENTS

| | | | |
|---|---|---|---|
| 0473148 | 3/1992 | European Pat. Off. | 526/245 |
| 53-139693 | 12/1978 | Japan | 526/245 |
| 2202904 | 8/1990 | Japan | 526/245 |
| 1175420 | 12/1969 | United Kingdom | 526/245 |

*Primary Examiner*—Joseph L. Schofer
*Assistant Examiner*—N. Sarofim
*Attorney, Agent, or Firm*—Oblon, Spivak, McClelland, Maier & Neustadt

[57] ABSTRACT

A reflection preventing film comprising a copolymer, its salt or both of them, the copolymer having at least one recurring unit selected from the group consisting of recurring units represented by formulas (1) and (2) and at least one recurring unit represented by formula (3):

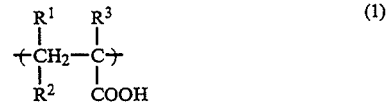

(1)

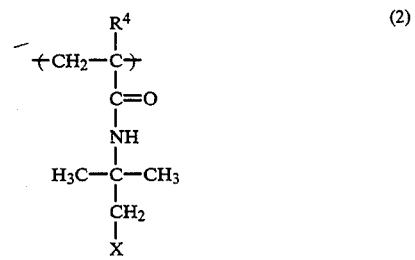

(2)

wherein $R^1$–$R^4$ which may be the same as or different from one another, represent hydrogen atoms or organic groups and X represents a carboxyl group or a sulfo group,

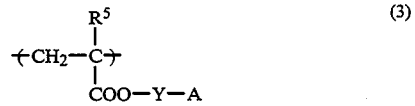

(3)

wherein $R^5$ represents a hydrogen atom or an organic group, A represents a fluoroalkyl group and Y represents an alkylene group or a fluoroalkylene group. The reflection preventing film is formed on a resist film before irradiation in the formation of a resist pattern, thereby preventing the radiation reflected on the substrate from re-reflecting at the upper interface of the resist film to provide a resist pattern excellent in resolution, developability and pattern form.

13 Claims, 1 Drawing Sheet

REFLECTION PREVENTING FILM AND PROCESS FOR FORMING RESIST PATTERN USING THE SAME

BACKGROUND OF THE INVENTION

This invention relates to a reflection preventing film which is useful for microprocessing in lithographic processes using various radiations, and to a process for forming a resist pattern using the reflection preventing film.

In the field of the production of integrated circuits, a lithographic process which enables fine processing in an order of subhalf micron is now being developed in order to obtain a higher degree of integration.

In this lithographic process, a desired pattern is obtained by coating a resist such as a positive type resist consisting of a novolak resin and a quinonediazide sensitizer usually in a thickness of 0.5-10 μm on a substrate, transferring the master pattern thereto using a stepper and then developing the same with a suitable developing solution.

However, radiations to be used in the process have a single wavelength, and hence, the incident radiation and the radiation reflected at the upper and lower interfaces of a resist film interfere with each other. As a result, there occurs a phenomenon called "standing wave effect" or "multiple interfering effect", namely the phenomenon that even if the amount of radiation applied is constant, the effective amount of radiation applied to the resist film is varied by the interference of the radiations with each other in the resist film when the thickness of the resist film is fluctuated, whereby the formation of a resist pattern is adversely affected in some cases. For example, when a slight change in composition and viscosity of resist and conditions for coating a resist results in a change in coating film thickness, or the presence of a step in the substrate results in a difference in coating film thickness (the thickness in concave portion becomes larger than that in convex portion), the effective amount of radiation applied is varied depending upon the film thickness thereof, the pattern dimension is varied and the pattern dimension precision is lowered.

In order to solve such problems, a process has heretofore been proposed which comprises forming a reflection preventing film on a resist film to inhibit the reflection at the resist film interface, thereby decreasing the multiple interference in the film [see Japanese Patent Application Kokai No. 60-38,821, J. Electrochem. Soc., Vol. 137, No. 12, 3900 (1990) and the like]. In this case, the reflection-inhibiting effect at the resist interface depends mainly upon the refractive index of reflection preventing film and the film thickness. The refractive index of an ideal reflection preventing film is $\sqrt{n}$ in which n is the refractive index of the resist. For example, where the resist is a novolak resin type resist (n=1.64), the ideal refractive index of a reflection preventing film is 1.28. The film thickness of an ideal reflection preventing film is odd time the $\lambda/4m$ in which $\lambda$ is the wavelength of a radiation and m is the refractive index of the reflection preventing film.

As the material for reflection preventing film, there have been known polysiloxane, polyethyl vinyl ether and polyvinyl alcohol. However, a reflection preventing film consisting of one of these materials has the following problems: (i) Since the difference in refractive index from resist is small, the standing wave effect cannot be sufficiently inhibited (the basic problem). (ii) When combined with a certain resist, the material is slightly mixed with the resist (this is called intermixing) and modifies the resist, whereby such resist performances as resolution, pattern shape and the like are deteriorated. (iii) When a reflection preventing film insoluble in water or a developing solution is used, it is necessary to remove the film with a reflection preventing film removing agent separately before the development. (iv) Even when polyethyl vinyl ether or polyvinyl alcohol is used as a reflection preventing film, it cannot always be said that the film is sufficient in solubility in water or a developing solution, and a residue remains on the resist, and in some cases, resist performances such as resolution, developability, pattern form and the like are deteriorated.

SUMMARY OF THE INVENTION

An object of this invention is to provide a novel reflection preventing film which can sufficiently reduce the standing wave effect and simultaneously does not cause intermixing, and is good in solubility in water and a developing solution.

Another object of this invention is to provide a process for forming a resist pattern which enables the production of a resist pattern excellent in resolution, developability, pattern form and the like.

Other objects and advantages of this invention will become apparent from the following description.

According to this invention, there is provided a reflection preventing film comprising a copolymer having at least one recurring unit selected from the group consisting of recurring units represented by formulas (1) and (2) and at least one recurring unit represented by formula (3), and/or a salt of the copolymer:

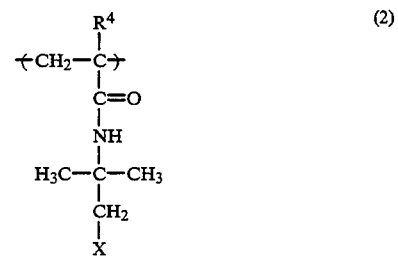

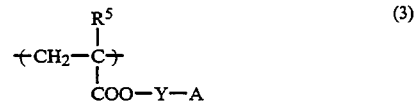

wherein $R^1$ to $R^4$, which may be the same as or different from one another, represent hydrogen atoms or organic groups, $R^5$ represents a hydrogen atom or an organic group, A represents a fluoroalkyl group, X represents a carboxyl group or a sulfo group and Y represents an alkylene group or a fluoroalkylene group.

This invention also provides a process for forming a resist pattern, which comprises coating a resist on a substrate to form a resist film, irradiating the resist film with a radiation in the desired pattern form and then developing the resist film, characterized by forming a reflection preventing film on the above resist film before the irradiation.

BRIEF DESCRIPTION OF THE DRAWINGS

The accompanying drawing is an explanatory view showing the cross-sectional shapes of resist patterns, in which various shapes A–E are shown. Shape A is excellent, Shapes B and C are good and Shapes D and E are bad.

DETAILED DESCRIPTION OF THE INVENTION

Figure 1:
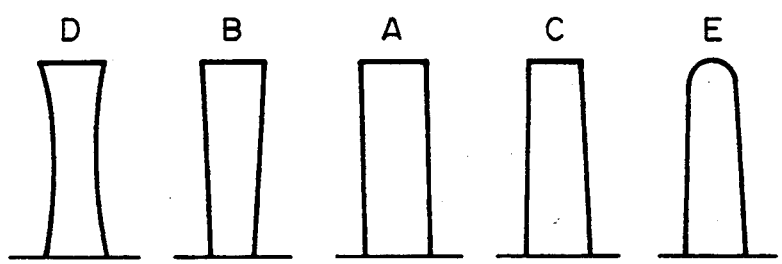

The reflection preventing film of this invention is formed on a resist film. In the formation of a resist pattern, some of the radiations applied reflect on the substrate. The reflection preventing film of this invention has an action of preventing the reflecting radiations from re-reflecting at the upper interface of the resist film.

The copolymer composing the reflection prevention film can be prepared by copolymerizing a monomer mixture of at least one monomer selected from the group consisting of unsaturated carboxylic acid monomers and unsaturated sulfonic acid monomers corresponding to the recurring units represented by formulas (1) and (2) and at least one monomer selected from the group consisting of fluoroalkyl acrylates and fluoroalkyl methacrylates corresponding to the recurring units represented by formula (3).

In formulas (1), (2) and (3), the organic group of $R^1$ to $R^5$ includes alkyl groups having, preferably, 1 to 10 carbon atoms such as methyl, ethyl and the like; carboxyl group; carboxyalkyl groups having, preferably, 2–10 carbon atoms such as carboxymethyl, carboxyethyl, carboxypropyl and the like; alkoxycarbonyl groups having, preferably, 2–10 carbon atoms such as methoxycarbonyl, ethoxycarbonyl and the like; acyloxy groups having, preferably, 2–10 carbon atoms such as acetyloxy, propionyloxy, benzoyloxy and the like; aryl groups having, preferably, 6–10 carbon atoms such as phenyl, cumenyl and the like; aralkyl groups having, preferably 7–12 carbon atoms such as benzyl, α-methylbenzyl and the like; alkoxy groups having, preferably, 1–10 carbon atoms such as methoxy, ethoxy and the like; cycloalkyl groups having, preferably, 3–10 carbon atoms such as cyclopentyl, cyclohexyl and the like; cyano group, etc.

In formula (3), the fluoroalkyl group of A may be a hydrofluoroalkyl group or a perfluoroalkyl group, and the fluoroalkylene group of Y may be a hydrofluoroalkylene group or a perfluoroalkylene group.

The above-mentioned unsaturated carboxylic acid monomer includes, for example, unsaturated monocarboxylic acids such as (meth)acrylic acid, crotonic acid, cinnamic acid, atropic acid, 3-acetyloxy(meth)acrylic acid, 3-benzoyloxy(meth)acrylic acid, α-methoxyacrylic acid, 3-cyclohexyl(meth)acrylic acid and the like; unsaturated polycarboxylic acids such as fumaric acid, maleic acid, citraconic acid, mesaconic acid, itaconic acid and the like; monoesters of the above unsaturated polycarboxylic acids such as monomethyl esters, monoethyl esters, mono-n-propyl esters, mono-n-butyl esters and the like as those corresponding to formula (1); and 2-(meth)acrylamido-2-methylpropanecarboxylic acid, 2-α-carboxyacrylamido-2-methylpropanecarboxylic acid, 2-α-carboxymethylacrylamido-2-methylpropanecarboxylic acid, 2-α-methoxycarbonylacrylamido-2-methylpropanecarboxylic acid, 2-α-acetyloxyacrylamido-2-methylpropanecarboxylic acid, 2-α-phenylacrylamido-2-methylpropanecarboxylic acid, 2-α-benzylacrylamido-2-methylpropanecarboxylic acid, 2-α-methoxyacrylamido-2-methylpropanecarboxylic acid, 2-α-cyclohexylacrylamido-2-methylpropanecarboxylic acid, 2-α-cyanoacrylamido-2-methylpropanecarboxylic acid and the like as those corresponding to formula (2).

The unsaturated sulfonic acid monomer corresponding to formula (2) includes, for example, 2-(meth)acrylamido-2-methylpropanesulfonic acid, 2-α-carboxyacrylamido-2-methylpropanesulfonic acid, 2-α-carboxymethylacrylamido-2-methylpropanesulfonic acid, 2-α-methoxycarbonyl-acrylamido-2-methylpropanesulfonic acid, 2-α-acetyloxyacrylamido-2-methylpropanesulfonic acid, 2-α-phenylacrylamido-2-methylpropanesulfonic acid, 2-α-benzylacrylamido-2-methylpropanesulfonic acid, 2-α-methoxyacrylamido-2-methylpropanesulfonic acid, 2-α-cyclohexylacrylamido-2-methylpropanesulfonic acid, 2-α-cyanoacrylamido-2-methylpropanesulfonic acid and the like.

The unsaturated carboxylic acid monomer and unsaturated sulfonic acid monomer may be used alone or in admixture of two or more depending upon the desired properties of the reflection preventing film.

The fluoroalkyl (meth)acrylate monomer includes, for example, 2,2-difluoroethyl acrylate, 2,2-difluoroethyl methacrylate, 2,2,2-trifluoroethyl acrylate, 2,2,2-trifluoroethyl methacrylate, 3,3,3-trifluoropropyl acrylate, 3,3,3-trifluoropropyl methacrylate, 2,2,3,3-tetrafluoropropyl acrylate, 2,2,3,3-tetrafluoropropyl methacrylate, 2,2,3,3,3-pentafluoropropyl acrylate, 2,2,3,3,3-pentafluoropropyl methacrylate, 2,2,2,2',2',2'-hexafluoroisopropyl acrylate, 2,2,2,2',2',2'-hexafluoroisopropyl methacrylate, 2,2,3,3,4,4-hexafluorobutyl acrylate, 2,2,3,3,4,4-hexafluorobutyl methacrylate, 2,2,3,4,4,4-hexafluorobutyl acrylate, 2,2,3,4,4,4-hexafluorobutyl methacrylate, 2,2,3,3,4,4,4-heptafluorobutyl acrylate, 2,2,3,3,4,4,4-heptafluorobutyl methacrylate, 2,2,3,3,4,4,5,5-octafluoropentyl acrylate, 2,2,3,3,4,4,5,5-octafluoropentyl methacrylate, 3,3,4,4,5,5,6,6,6-nonafluorohexyl acrylate, 3,3,4,4,5,5,6,6,6-nonafluorohexyl methacrylate, 2,2,3,3,4,4,5,5,6,6,7,7-dodecafluoroheptyl acrylate, 2,2,3,3,4,4,5,5,6,6,7,7-dodecafluoroheptyl methacrylate, 3,3,4,4,5,5,6,6,7,7,8,8,8-tridodecafluorooctyl acrylate, 3,3,4,4,5,5,6,6,7,7,8,8,8-tridodecafluorooctyl methacrylate, 2,2,3,3,4,4,5,5,6,6,7,7,8,8,9,9-hexadecafluorononyl acrylate, 2,2,3,3,4,4,5,5,6,6,7,7,8,8,9,9-hexadecafluorononyl methacrylate, 2,2,3,3-tetrafluoro-1-methylpropyl acrylate, 2,2,3,3-tetrafluoro-1-methylpropyl methacrylate, 2,2,3,3-tetrafluoro-1,1-dimethylpropyl acrylate, 2,2,3,3-tetrafluoro-1,1-dimethylpropyl methacrylate, 2,2,3,3,4,4,5,5-octafluoro-1,1-dimethylpentyl acrylate, 2,2,3,3,4,4,5,5-octafluoro-1,1-dimethylpentyl methacrylate, β-(perfluorooctyl)ethyl acrylate, β-(perfluorooctyl)ethyl methacrylate, 3-[4-[1-trifluoromethyl2,2-bis[bis(trifluoromethyl)fluoromethyl]ethynyloxy]benzoxy] 2-hydroxypropylacrylate, 3-[4-[1-trifluoromethyl-2,2-bis[bis(trifluoromethyl)fluoro-methyl]ethynyloxy]benzoxy] 2-hydroxypropylmethacrylate, (2,2,2-trifluoroethyl) 2-carboxyacrylate, (2,2,2-trifluoroethyl) 2-carboxymethylacrylate, (2,2,2-trifluoroethyl) 2-methoxycarbonylacrylate, (2,2,2-trifluoroethyl) 2-acetyloxyacrylate, (2,2,3,3,3-pentafluoropropyl) 2-phenylacrylate, (2,2,3,3,3-pentafluoropropyl) 2-benzylacrylate, (2,2,3,3,3-pentafluoropropyl) 2-ethoxyacrylate, (2,2,3,3,3-pentafluoropropyl) 2-cyclohexylacrylate, (2,2,3,3,3-pentafluoropropyl) 2-cyanoacrylate, etc.

These fluoroalkyl (meth)acrylate monomers may be used alone or in admixture of two or more depending upon the desired characteristics of the reflection preventing film.

In this invention, the proportions of the unsaturated carboxylic acid monomer, the unsaturated sulfonic acid monomer and the fluoroalkyl (meth)acrylate monomer copolymerized are such that the total amount of the units of formulas (1) and (2) is preferably 5–99.9% by weight, more preferably 7–80% by weight, most preferably 10–70% by weight, based on the total amount of the units of formulas (1), (2) and (3), and the amount of the unit derived from the fluoroalkyl (meth)acrylate monomer of formula (3) is preferably 95–0.1% by weight, more preferably 93–20% by weight, most preferably 90–30% by weight based on the total amount of the units of formulas (1), (2) and (3).

When the total amount of the units of formulas (1) and (2) is less than 5% by weight and the amount of the unit of formula (3) exceeds 95% by weight, there is a tendency that the solubility of the reflection preventing film in water or a developing solution is lowered and the pattern form and developability are deteriorated. When the total amount of the units of formulas (1) and (2) exceeds 99.9% by weight and the amount of the unit of formula (3) is less than 0.1% by weight, in some cases, the reduction of standing wave effect becomes insufficient and the film formability becomes low.

The copolymer composing the reflection preventing film of this invention may contain, in addition to the unsaturated carboxylic acid monomer, the unsaturated sulfonic acid monomer and the fluoroalkyl (meth)acrylate monomer, other vinyl or diene comonomers in a proportion of, for example, 3–40% by weight, preferably 5–30% by weight, based on the total weight of the monomers. Such other vinyl or diene comonomers include vinyl carboxylate compounds such as vinyl acetate, vinyl propionate, vinyl caproate and the like; vinyl cyanide compounds such as acrylonitrile, methacrylonitrile, α-chloroacrylonitrile and the like; unsaturated carboxylic acid ester compounds such as methyl acrylate, methyl methacrylate, ethyl acrylate, ethyl methacrylate, propyl acrylate, propyl methacrylate, butyl acrylate, butyl methacrylate and the like; aromatic vinyl compounds such as styrene, α-methylstyrene, vinyltoluene and the like; olefin halide compounds such as vinyl chloride, vinylidene chloride, vinylidene fluoride, tetrafluoroethylene, hexafluoropropylene and the like; diene compounds such as butadiene, isoprene, chloroprene, piperylene, 2,3-dimethylbutadiene, methylpentadiene, cyclopentadiene, vinyl cyclohexene, ethylidenenorbornene, divinylbenzene, dimethylvinylstyrylsilane and the like; epoxy-containing vinyl compounds such as glycidyl acrylate, glycidyl methacrylate, allyl glycidyl ether and the like; halogen-containing vinyl compounds such as 2-chloroethyl vinyl ether, vinyl chloroacetate, allyl chloroacetate, chloromethylstyrene and the like; hydroxyl-containing vinyl compounds such as 2-hydroxyethyl acrylate, 2-hydroxyethyl methacrylate, 2-hydroxypropyl acrylate, 2-hydroxypropyl methacrylate, hydroxystyrene, N-methylol acrylamide, N-methylol methacrylamide, allyl alcohol, methallyl alcohol and the like; amido-containing vinyl compounds such as acrylamide, methacrylamide and the like; carboxyl-containing vinyl compounds such as 2-methacryloyloxyethylsuccinic acid, 2-methacryloyloxyethylphthalic acid, 2-methacryloyloxyethylhexahydrophthalic acid, 2-methacryloyloxyethylmaleic acid and the like; etc.

These comonomers may be used alone or in admixture of two or more.

The copolymer composing the reflection preventing film of this invention can be produced by a suitable method such as radical polymerization, anionic polymerization, cationic polymerization, coordination polymerization or the like in a polymerization manner such as bulk polymerization, suspension polymerization, bulk-suspension polymerization, emulsion polymerization, solution polymerization, precipitation polymerization and the like.

The above-mentioned copolymer may have various structures such as random copolymer, block copolymer, graft copolymer and the like. In the block copolymer, the unsaturated carboxylic acid monomer, the unsaturated sulfonic acid monomer and the fluoroalkyl (meth)acrylate monomer may be present in the same polymer block or in different polymer blocks. In the graft copolymer, the unsaturated carboxylic acid monomer, the unsaturated sulfonic acid monomer and the fluoroalkyl (meth)acrylate monomer may be present together in the backbone polymer and/or graft polymer, or alternatively, either of the monomers may form the backbone polymer and/or the graft polymer.

The copolymer obtained as mentioned above can be used as such as a reflection preventing film in the state that it has the free carboxyl group and/or free sulfo group; however, it can be used after a part or the whole of the carboxyl groups and/or sulfo groups in the copolymer have been neutralized. In this neutralization, it is preferable to add water to the copolymer in the presence of ammonia and/or an organic amine and mix them. In this invention, the neutralized copolymer may be used alone or in admixture with the unneutralized copolymer.

The organic amine which may be used for the neutralization includes monoamines such as trimethylamine, triethylamine, propylamine, butylamine, 2-dimethylethanolamine, diethanolamine, triethanolamine, aminomethylpropanol, morpholine and the like; polyamines such as diethylenediamine, diethylenetriamine and the like; etc.

When the copolymer composing the reflection preventing film of this invention have carbon-carbon unsaturations in the molecule, the copolymer may be hydrogenated before its use.

The polystyrene reduced number average molecular weight (referred to hereinafter as Mn) of the copolymer having at least one of the recurring units represented by formulas (1) and (2) and at least one recurring unit represented by formula (3) or the salt of the copolymer may be appropriately varied depending on the desired characteristics of reflection preventing film, and is preferably 1,000–1,000,000, more preferably 1,500–500,000, most preferably 2,000–100,000. When Mn is less than 1,000, there is a tendency that the coatability, film-formability and the like required for forming a reflection preventing film are lowered, and when Mn exceeds 1,000,000, the solubility in water or a developing solution, coatability and the like are in some cases lowered. Incidentally, when Mn is as relatively low as 1,000–100,000 a particularly excellent coatability can be obtained.

The reflection preventing film of this invention is composed of a material comprising a copolymer having at least one unit selected from the units represented by formulas (1) and (2) and at least one recurring unit represented by formula (3) and/or a salt of the copolymer (said material being referred to hereinafter as the reflection preventing film material), and the reflection preventing film material may contain various additives as far as the desired effect of this invention is not impaired.

The above-mentioned additives include other water-soluble polymers, alkali-soluble polymers, surface active agents, compounds which can generate an acid upon irradiation with a radiation (referred to hereinafter as the acid-generating agent) and the like.

Said other water-soluble polymers and alkali-soluble polymers include, for example, polyvinyl alcohol, polymethyl vinyl ether, polyethyl vinyl ether, polyethylene glycol, polyammonium acrylate, polyhydroxystyrene or its derivatives, styrene-maleic anhydride copolymer or its hydrolysis products, polyvinyl hydroxybenzoate, carboxyl-containing acrylic resins, carboxyl-containing methacrylic resins and the like.

The above-mentioned surface active agents have an action of improving coatability, for example, striation or wettability; developability; and the like. Such surface active agents include, for example, non-ionic surface active agents such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and the like; and also include, as commercially available surfactants, KP 341 (a trade name of Shin-Etsu Chemical Co., Ltd. for organosiloxane polymer), Polyflow No. 75 and No. 95 (trade names of Kyoeisha Yushikagaku Kogyo for acrylic or methacrylic acid (co)polymer), F Top EF 301, EF 303, EF 352, EF 101 and EF 204 (trade names of Shin Akita Kasei), Megafac F 171 and F 173 (trade names of DAINIPPON INK & CHEMICALS), Fluorad FC 430 and FC 431 (trade names of Sumitomo 3M), Asahi Guard AG 710, Surflon S-382, Surflon SC 101, SC 102, SC 103, SC 104, SC 105 and SC 106 (trade names of Asahi Glass), and the like.

Of the above-mentioned surface active agents, fluorine-containing surface active agents such as F Top, Megafac, Fluorad, Asahi Guard, Surflon and the like are preferred because the compounding of them results in a reduction of the refractive index of the reflection preventing film to make the difference in refractive index from the resist great.

The amount of the surface active agent added is preferably 100 parts by weight or less, more preferably 70 parts by weight or less, most preferably 40-60 parts by weight, per 100 parts by weight of the solid content of the reflection preventing film material.

The acid-generating agent has an action of improving the pattern form of resist, resolution, developability and the like. The acid-generating agent includes, for example, compounds described in Japanese Patent Application Kokai Nos. 60-115,932; 60-37,549; 60-52,845; 63-292,128; and 1-293,339 and the like, and specifically, the following onium salts, haloalkyl group-containing compounds, o-quinonediazide compounds, nitrobenzyl compounds, sulfonic acid ester compounds and sulfone compounds can be used:

(1) Onium Salts
Compounds represented by formulas (4), (5) and (6):

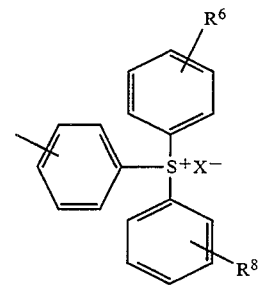 (4)

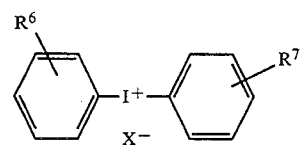 (5)

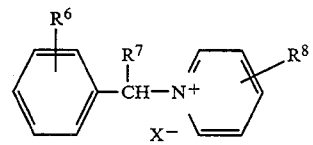 (6)

wherein $R^6$, $R^7$ and $R^8$, which may be the same as or different from one another, represent hydrogen atoms, amino groups, nitro groups, cyano groups, alkyl groups or alkoxy groups; X represents $SbF_6$, $AsF_6$, $PF_6$, $BF_4$, $CF_3CO_2$, $ClO_4$, $CF_3SO_3$,

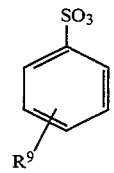

($R^9$ represents a hydrogen atom, an amino group, an anilino group, an alkyl group or an alkoxy group),

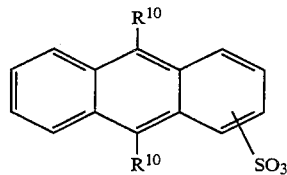

($R^{10}$'s may be the same as or different from each other and represent alkoxy groups)

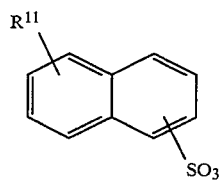

($R^{11}$ represents a hydrogen atom, an amino group, an anilino group, an alkyl group or an alkoxy group) or

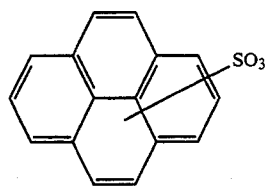

(2) Haloalkyl Group-Containing Compounds
Compounds represented by formulas (7) and (8):

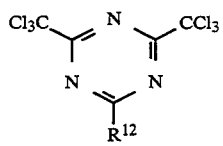

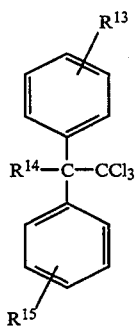

wherein $R^{12}$ represents a trichloromethyl group, a phenyl group, a methoxyphenyl group, a naphthyl group or a methoxynaphthyl group, $R^{13}$–$R^{15}$, which may be the same as or different from one another, represent hydrogen atoms, halogen atoms, methyl groups, methoxy groups or hydroxyl groups.

(3) o-Quinonediazide Compounds
Compounds represented by formulas (9) and (10):

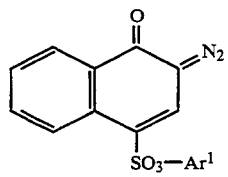

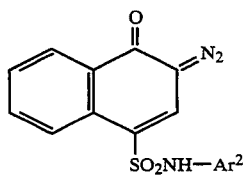

wherein $Ar^1$ represents

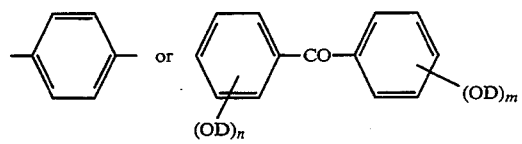

(D represents a hydrogen atom or a 1,2-naphthoquinone-diazide-4-sulfonyl group, m and n represent integers of 0–3, and $Ar^2$ represents

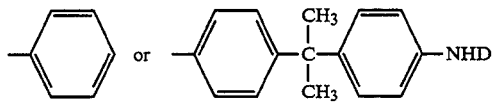

(D represents a hydrogen atom or a 1,2-quinonediazide-4-sulfonyl group.

(4) Nitrobenzyl Compounds
Compounds represented by formula (11):

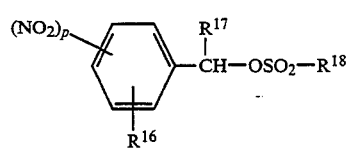

wherein p represents an integer of 1–3, $R^{16}$ represents an alkyl group, $R^{17}$ represents a hydrogen atom or an alkyl group and $R^{18}$ represents

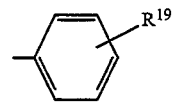

($R^{19}$ represents a hydrogen atom or an alkyl group),

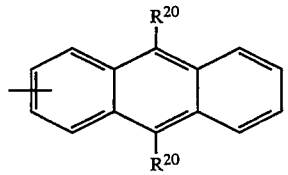

($R^{20}$ represents an alkoxy group), or

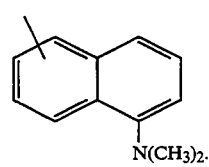

(5) Sulfonic Acid Ester Compounds
Compounds represented by formulas (12)–(15):

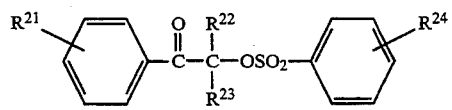

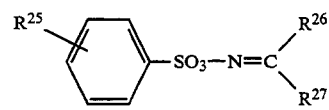

-continued

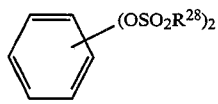

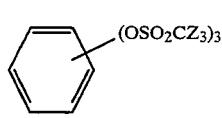 (14)

wherein $R^{21}$ and $R^{24}$, which may be the same as or different from each other, represent hydrogen atoms or alkyl groups; $R^{22}$ and $R^{23}$, which may be the same as or different from each other, represent hydrogen atoms, alkyl groups or aryl groups; $R^{25}$ represents a hydrogen atom or an alkyl group; $R^{26}$ and $R^{27}$, which may be the same as or different from each other, represent alkyl groups or aryl groups or bonded to each other to form a ring with the carbon atom to which they are attached; $R^{28}$ represents a methyl group, a trifluoromethyl group, a trichloromethyl group, a phenyl group, a tolyl group, a cyanophenyl group, a trichlorophenyl group or a trifluoromethylphenyl group; Z represents a fluorine atom, a chlorine atom, a hydrogen atom, an alkyl group or an aryl group.

(6) Sulfone Compounds

Compounds represented by formula (16):

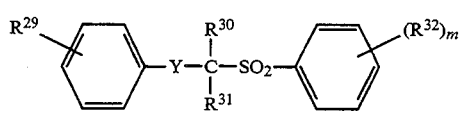 (16)

wherein Y represents a —CO— group or a —$SO_2$— group; $R^{29}$-$R^{32}$, which may be the same as or different from one another, represent halogen atoms or alkyl groups; and m represents an integer of 0-3.

Of these acid-generating agents, the onium salts are particularly preferred.

The acid-generating agents may be used alone or in admixture of two or more, and the amount of the acid-generating agent added is preferably 20 parts by weight, more preferably 2-10 parts by weight, per 100 parts by weight in total of the polymer components in the reflection preventing film material. When the amount of the acid-generating agent used exceeds 20 parts by weight, there is a fear that the developability may be lowered.

As other additives, a light absorber, a storage stabilizer, a antifoaming agent and the like may be used.

The reflection preventing film of this invention comprising a copolymer composed of at least one recurring unit selected from the recurring units represented by formulas (1) and (2) and at least one recurring unit represented by formula (3) and/or a salt of the copolymer, and is formed on a resist film using a reflection preventing film material comprising the copolymer and/or its salt and if necessary, various additives. In the formation of the reflection preventing film, the predetermined amount of the reflection preventing film material is dissolved in a solvent so that the solid concentration becomes, for example, 2-10% by weight, the solution is filtered through a filter having a pore diameter of, for example, about 0.2 μm to prepare a solution, and this solution is coated on the resist film by such a method as spin-coating, flowcoating, roll-coating or the like.

The solvent used in the preparation of the solution of the reflection preventing film material may be a solvent in which the reflection preventing film material can be dissolved, and is appropriately selected from, for example, water; alcohols such as methanol, ethanol, isopropanol and the like; 2-methoxyethyl acetate; 2-ethoxyethyl acetate; ethylene glycol monomethyl ether; ethylene glycol monoethyl ether; diethylene glycol monomethyl ether; diethylene glycol monoethyl ether; diethylene glycol monobutyl ether; propylene glycol methyl ether acetate; propylene glycol ethyl ether acetate; propylene glycol propyl ether acetate; methyl ethyl ketone; cyclohexanone; methyl 2-hydroxypropionate; ethyl 2-hydroxypropionate; ethyl 2-hydroxy-2-methylpropionate; methyl 3-methoxypropionate; ethyl 3-ethoxypropinate; ethyl ethoxyacetate; ethyl hydroxyacetate; methyl 2-hydroxy-3-methylbutyrate; 3-methyl-3-methoxybutyl acetate; 3-methyl-3-methoxybutyl propionate; 3-methyl-3-methoxybutyl butyrate; ethyl acetate; butyl acetate; methyl 3-methoxypropionate; ethyl pyruvate; benzyl ethyl ether; dihexyl ether; acetonylacetone; isophorone; caproic acid; caprylic acid; benzyl acetate; ethyl benzoate; diethyl oxalate; diethyl maleate; γ-butyrolactone; ethylene carbonate; propylene carbonate; phenyl Cellosolve acetate and the like. These may be used alone or in admixture of two or more.

Of the above-mentioned solvents, those containing 10% by weight or more of water and/or alcohols are preferred.

The process for forming a resist pattern of this invention comprises coating a resist on a substrate to form a resist film, forming the above-mentioned reflection preventing film on the resist film, irradiating the resist film with a radiation (the irradiation is referred to hereinafter as "exposing") in the desired pattern and then developing the exposed resist film.

The resist used in the process of this invention may be adequately varied depending upon the purpose of use of resist pattern. Examples thereof include positive type resists consisting of a novolak resin and a quinonediazide sensitizer, negative type resists consisting of an alkali-soluble resin and a cross-linking agent, and positive or negative type chemically amplified resist containing an acid-generating agent.

In the formation of a resist film from these resists, each resist is dissolved in an appropriate solvent at a solid concentration of, for example, 5-50% by weight, and the resulting solution is filtered through a filter having a pore diameter, for example, about 0.2 μm to prepare a solution, This resist solution is coated on a substrate such as silicon wafer, aluminum-coated wafer or the like and then pre-baked to volatilize the solvent, thereby forming a resist film. In this case, needless to say, a commercially available resist solution can be used as it is.

Subsequently, as stated above, the reflection preventing material solution is coated on the resist film thus obtained and usually baked again to form the reflection preventing film of this invention. In this case, when the thickness of the reflection preventing film is closer to odd time the μ/4m value (μ is the wavelength of radiation and m is the refractive index of reflection preventing film), the reflection preventing effect at the upper interface of the resist film becomes larger.

In this invention, either the pre-baking after coating a resist solution or the baking after coating a reflection preventing film material solution can be omitted for simplification of the process.

Subsequently, the resulting assembly is partially exposed to radiation. The radiation used in this case may be any radiation including ultraviolet rays such as visible rays, g-rays, i-rays and the like; far ultraviolet rays such as excimer laser and the like; etc. In this case, in order to enhance the resolution, pattern form and developability of the resist, it is preferable to conduct baking after the exposure. The temperature of this baking may be varied appropriately depending upon the kind of the resist used, and is preferably about 30°–200° C., more preferably 50°–150° C.

The resist film is then developed with a developing solution, washed to form the desired resist pattern. In this case, the reflection preventing film of this invention can be completely removed during the development or washing without requiring any separate removing step. This is one of the important characteristic features of this invention.

The developing solution used in this invention includes, for example, aqueous alkaline solutions prepared by dissolving in water alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5,4,0]-7-undecene, 1,5-diazabicyclo[4,3,0]-5-nonene and the like.

These developing solutions may have added thereto a water-soluble organic solvent, for example, an alcohol such as methanol, ethanol or the like and a surface active agent in suitable amounts.

The reflection preventing film of this invention can inhibit the reflection of a radiation at the interface between the reflection preventing film and the resist film, and can sufficiently diminish the standing wave effect. Accordingly, when a resist pattern is formed using the reflection preventing film of this invention, even if there is a step in a substrate or the composition and viscosity of the resist and the resist-coating conditions are varied, the change in dimension of resist pattern can be made very small and fine patterns can be formed with high precision. In addition, according to this invention, the resolution, developability, pattern form and the like of resist can be kept at a high level.

Accordingly, this invention can greatly contribute the production of integrated circuits of high degree of integration, and regardless of shape of substrate, various fine resist patterns can be produced with high precision according to this invention.

DESCRIPTION OF PREFERRED EMBODIMENTS

This invention is explained in more detail below referring to Examples and Comparative Examples, and this invention is not limited to the Examples.

The resists used in the Examples and the Comparative Examples are as follows.
Kind of Resist
 Resist A: Novolak resin type positive type resist (trade name: PFR IX170, manufactured by Japan Synthetic Rubber)
 Resist B: Positive type chemically amplified resist. Solution obtained by uniformly mixing 100 parts by weight of polyhydroxystyrene (Mn=10,000), 50% by weight of hydroxyl groups of which has been t-butoxycarbonylized, 2 parts by weight of triphenylsulfonium-hexafluoroantimonate (acid-generating agent) and 300 parts by weight of propylene glycol methyl ether acetate, and then filtering the mixture through a membrane filter having a pore diameter of 0.2 $\mu$m.

The formation of a resist pattern and the evaluation of performances of a reflection preventing film were conducted as follows:
Formation of Resist Pattern Each resist was spin-coated on a silicon wafer, then pre-baked on a hot plate at 90° C. for 2 minutes to form a resist film having a thickness of 1 $\mu$m. Subsequently, an aqueous solution of each reflection preventing film material was spin-coated on the resist film so that the film thickness was in the range of 40–70 nm and became odd time the $\lambda/4m$ value ($\lambda$: wavelength of radiation, m: refractive index of reflection preventing film). When resist A was used, Stepper NSR1505i6A manufactured by Nikon (numerical aperture: 0.45, wavelength: 365 nm) was used as a stepper and exposure was conducted for the predetermined period of time. When resist B was used, Stepper NSR1505EX manufactured by Nikon (numerical aperture: 0.42, wavelength: 248 nm) was used as a stepper and exposure was conducted for the predetermined period of time. Subsequently, baking after exposure was conducted for 1 minute on a hot plate at 110° C., and then, development was conducted with 2.38% by weight aqueous solution of tetramethylammonium hydroxide, and thereafter, water-washing and drying were conducted to obtain a resist pattern.
Evaluation of Performances of Reflection Preventing Film (1) Resolution: The dimension of the minimum resist pattern obtained by resolution was measured by a scanning electron microscope.

(2) Developability: The proportions of scum caused by residue of reflection preventing film or resist film and the proportion of undeveloped portion were checked by a scanning electron microscope.

(3) Pattern form: The cross-sectional shape of resist pattern was observed by a scanning electron microscope and evaluated based on the standard shown in the accompanying drawing.

(4) Standing wave effect: Resist films having thicknesses falling within the range of 1–1.5 $\mu$m but different by 0.01 $\mu$m were formed on silicon wafers, and subsequently, reflection preventing films were formed thereon as mentioned above. Using the above-mentioned stepper, the resist films were exposed to radiation in a varying exposure on each wafer, and subsequently, after-exposure-baking, development and the like were conducted as mentioned above to form resist patterns. Thereafter, each wafer was observed by an optical microscope to determine the minimum exposure in which no film remained in the space portion having a width of 100 $\mu$m. The minimum exposure was taken as a sensitivity for the respective film thickness. The maximum value of the sensitivities obtained is called $E_{max}$ and the minimum value is called $E_{min}$. The S value (change in sensitivity accompanying change in film thickness, namely dimension change) represented by the following equation is used as an indication of standing wave effect and it is determined that when S is less than 10 the standing wave effect is small, when S is in the range of 10–25 the standing wave effect is middle, and when S is more than 25 the standing wave effect is large:

$$S = (E_{max} - E_{min}) \times 100 / E_{max}$$

(5) Intermixing (IM): Using a scanning electron microscope, the cross-sectional shape of resist was observed and the presence or absence of thin (100 nm or less) insolubilized layer at the top of resist was checked, said layer being formed as a result of the resist film surface being mixed with the reflection preventing film by intermixing to become difficult to dissolve in the developing solution even when exposed to light. When the insolubilized layer was found it is determined that intermixing was caused, and when no insolubilized layer was found it is determined that no intermixing was caused.

Production of Copolymer Composing Reflection Preventing Film

The copolymers composing the reflection preventing films used in the Examples were prepared according to the following Synthesis Examples, in which part and % are by weight unless otherwise specified. Incidentally, copolymers composing the reflection preventing film used in Comparative Examples are shown in the respective Tables.

Synthesis Example 1

In a stainless steel autoclave provided with a stirrer, a thermometer, a heater, a monomer-feeding pump and a nitrogen gas-introducing means was placed 140 parts of butyl Cellosolve, and the gas phase was substituted by nitrogen for 15 minutes, after which the inner temperature was elevated to 80° C. Subsequently, a mixture of 40 parts of itaconic acid, 30 parts of methyl methacrylate, 30 parts of 2,2,3,3,3-pentafluoropropyl acrylate and 2 parts of benzoyl peroxide was continuously added over 3 hours while the inner temperature was kept at 80° C. After completion of the addition, the mixture was subjected to reaction for a further 2 hours at 85°–95° C., and then cooled to 25° C. Subsequently, the solvent was removed by vacuum drying to obtain a copolymer. This copolymer is referred to hereinafter as Copolymer A. Incidentally, the copolymerization proportion of itaconic acid/methyl methacrylate/2,2,3,3,3-pentafluoropropyl acrylate of Copolymer A was 39/30/31 (%). The Mn of Copolymer A was $3.0 \times 10^4$.

Synthesis Example 2

In a separable flask provided with a stirrer, a thermometer and a cooling tube was placed 170 parts of methanol, and a nitrogen gas was bubbled for 15 minutes. Thereto were added 40 parts of itaconic acid, 30 parts of ethyl acrylate, 30 parts of 2,2,2-trifluoroethyl acrylate and 4 parts of azobisisobutyronitrile, and the inner temperature was elevated to 60° C. After one hour, the inner temperature was elevated to 80° C., and the mixture was subjected to reaction for a further 4 hours and then cooled to 25° C. Subsequently, the solvent was removed by vacuum drying to obtain a copolymer. This copolymer is referred to hereinafter as Copolymer B. Incidentally, the copolymerization proportion of itaconic acid/ethyl acrylate/2,2,2-trifluoroethyl acrylate of Copolymer B was 40/30/30 (%). The Mn of Copolymer B was $1.5 \times 10^4$.

Synthesis Example 3

In a separable flask provided with a stirrer, a thermometer and a cooling tube was placed 170 parts of methanol, and a nitrogen gas was bubbled for 15 minutes. Thereto were added 50 parts of acrylic acid, 50 parts of 2,2,3,3,3-pentafluoropropyl methacrylate and 4 parts of azobisisobutyronitrile, and then, the inner temperature was elevated to 60° C. After one hour, the inner temperature was elevated to 80° C., and the mixture was subjected to reaction for a further 4 hours and then cooled to 25° C. Subsequently, the solvent was removed by vacuum drying to obtain a copolymer. This copolymer is referred to hereinafter as Copolymer C. Incidentally, the copolymerization proportion of acrylic acid/2,2,3,3,3-pentafluoropropyl methacrylate of Copolymer C was 50/50 (%). The Mn of Copolymer C was $0.3 \times 10^4$.

Synthesis Example 4

In the same autoclave as in Synthesis Example 1 was placed 140 parts of butyl Cellosolve, and the gas phase was substituted by nitrogen, after which the inner temperature was elevated to 80° C. Subsequently, a mixture of 20 parts of itaconic acid, 10 parts of methyl methacrylate, 70 parts of 2,2,3,3,3-pentafluoropropyl acrylate and 2 parts of benzoyl peroxide was continuously added over 3 hours while the inner temperature was kept at 80° C. After completion of the addition, the mixture was subjected to reaction at 85°–95° C. for a further 2 hours, and then cooled to 25° C. Subsequently, the solvent was removed by vacuum drying to obtain a copolymer. Incidentally, the copolymerization proportion of itaconic acid/methyl methacrylate/2,2,3,3-pentafluoropropyl acrylate of this copolymer was 20/10/70 (%). The copolymer was dissolved in an aqueous solution containing ammonia in a proportion of 2 moles per mole of the itaconic acid charged to obtain a copolymer salt solution having a solid content of 10%. This copolymer salt is referred to hereinafter as Copolymer D. The Mn of Copolymer D was $4.8 \times 10^4$.

Synthesis Example 5

In a separable flask provided with a stirrer, a thermometer and a cooling tube was placed 170 parts of methanol, and a nitrogen gas was bubbled for 15 minutes. Thereto were added 30 parts of itaconic acid, 40 parts of methacrylic acid, 30 parts of 2,2,2-trifluoroethyl acrylate and 4 parts of azobisisobutyronitrile, and the inner temperature was elevated to 60° C. After one hour, the inner temperature was elevated to 70° C., and the mixture was subjected to reaction for a further 5 hours and then cooled to 25° C. Subsequently, the solvent was removed by vacuum drying to obtain a copolymer. Incidentally, the copolymerization proportion of itaconic acid/methacrylic acid/2,2,2-trifluoroethyl acrylate of this copolymer was 30/40/30 (%). The copolymer was dissolved in an aqueous solution containing ammonia in a proportion of 2 moles pre mole of the itaconic acid charged to obtain a copolymer salt solution having a solid content of 10%. This copolymer salt is referred to hereinafter as Copolymer E. The Mn of Copolymer E was $3.8 \times 10^4$.

Synthesis Example 6

In a separable flask provided with a stirrer, a thermometer and a cooling tube was placed 170 parts of methanol, and a nitrogen gas was bubbled for 15 minutes. Thereto were added 40 parts of acrylic acid, 30 parts of ethyl acrylate, 30 parts of 2,2,2-trifluoroethyl acrylate and 4 parts of azobisisobutyronitrile, and the inner temperature was elevated to 60° C. After one hour, the inner temperature was elevated to 80° C., and the mixture was subjected to reaction for a further 4 hours and then cooled to 25° C. Subsequently, the solvent was removed by vacuum drying to obtain a copolymer. Incidentally, the copolymerization proportion of acrylic acid/ethyl acrylate/2,2,2-trifluroethyl acrylate of this copolymer was 39/30/31 (%). This copolymer was dissolved in an aqueous solution containing triethanolamine in an amount equimolar to the acrylic acid charged to obtain a copolymer salt solution having a solid content of 10%. This copolymer salt is referred to hereinafter as Copolymer F. The Mn of Copolymer F was $7.9 \times 10^4$.

Synthesis Example 7

The same procedure as in Synthesis Example 4 was repeated, except that monoethyl maleate was substituted for the itaconic acid to obtain a copolymer. Incidentally, the copolymerization proportion of monoethyl maleate/methyl methacrylate/2,2,3,3,3-pentafluoropropyl acrylate of this copolymer was 20/10/70 (%). This copolymer was dissolved in an aqueous solution containing ammonia in an amount equimolar to the monoethyl maleate charged, to obtain a copolymer salt solution having a solid content of 10%. This copolymer salt is referred to hereinafter as Copolymer G. The Mn of Copolymer G was $6.7 \times 10^4$.

Synthesis Example 8

The same procedure as in Synthesis Example 5 was repeated, except that the monomers charged were replaced with 20 parts of methacrylic acid and 80 parts of 2,2,2-trifluoroethyl acrylate to obtain a copolymer. Incidentally, the copolymerization proportion of methacrylic acid/2,2,2-trifluoroethyl acrylate of this copolymer was 20/80 (%). This copolymer was dissolved in an aqueous solution containing ammonia in an amount equimolar to the methacrylic acid charged, to obtain a copolymer salt solution having a solid content of 10%. This copolymer salt is referred to hereinafter as Copolymer H. The Mn of Copolymer H was $8.4 \times 10^4$.

Synthesis Example 9

Polymerization was conducted in the same manner as in Synthesis Example 5, except that fumaric acid was substituted for the itaconic acid to obtain a copolymer. Incidentally, the copolymerization proportion of fumaric acid/methacrylic acid/2,2,2-trifluoroethyl acrylate of this copolymer was 30/40/30 (%). This copolymer was treated in the same manner as in Synthesis Example 5 to obtain a copolymer salt solution having a solid content of 10%. This copolymer salt is referred to hereinafter as Copolymer I. The Mn of Copolymer I was $2.5 \times 10^4$.

Synthesis Example 10

The same procedure as in Synthesis Example 5 was repeated, except that the monomers charged were replaced with 40 parts of methacrylic acid, 30 parts of methyl methacrylate and 30 parts of 2,2,2-trifluoroethyl acrylate, to obtain a copolymer. Incidentally, the copolymerization proportion of methacrylic acid/methyl methacrylate/2,2,2-trifluoroethyl acrylate of this copolymer was 39/30/31 (%). This copolymer was dissolved in an aqueous solution containing ammonia in a proportion of 4/5 mole per mole of the methacrylic acid charged, to obtain a copolymer salt solution having a solid content of 10%. This copolymer salt is referred to hereinafter as Copolymer J. The Mn of Copolymer J was $3.4 \times 10^4$.

Synthesis Example 11

The same procedure as in Synthesis Example 5 was repeated, except that the solvent for synthesis was replaced with 150 parts of t-butanol and 20 parts of methanol, and the monomers charged were replaced with 10 parts of 2-acrylamido-2-methylpropanesulfonic acid, 55 parts of 2,2,2-trifluoroethyl acrylate and 35 parts of β-(perfluorooctyl)ethyl acrylate, to obtain a copolymer. Incidentally, the copolymerization proportion of 2-acrylamido-2-methylpropanesulfonic acid/2,2,2-trifluoroethyl acrylate/β-(perfluorooctyl)ethyl acrylate of this copolymer was 10/55/35 (%). This copolymer was dissolved in an aqueous solution containing triethanolamine in a proportion of 4/5 mole per mole of the 2-acrylamido-2-methylpropanesulfonic acid, to obtain a copolymer salt solution having a solid content of 10%. This copolymer salt is referred to hereinafter as Copolymer K. The Mn of Copolymer K was $4.2 \times 10^4$.

Synthesis Example 12

The same procedure as in Synthesis Example 5 was repeated, except that the solvent for synthesis was replaced with 170 parts of t-butanol, and the monomers charged were replaced with 25 parts of acrylic acid, 45 parts of 2,2,2-trifluoroethyl acrylate and 30 parts of β-(perfluorooctyl)ethyl acrylate to obtain a copolymer. Incidentally, the copolymerization proportion of acrylic acid/2,2,2-trifluoroethyl acrylate/β-(perfluorooctyl)ethyl acrylate of this copolymer was 25/45/30 (%). This copolymer was dissolved in an aqueous solution containing triethanolamine in a proportion of 4/5 mole per mole of the acrylic acid charged, to obtain a copolymer salt solution having a solid content of 10%. This copolymer salt is referred to hereinafter as Copolymer L. The Mn of Copolymer L was $9.0 \times 10^4$.

Synthesis Example 13

The same procedure as in Synthesis Example 11 was repeated, except that 2-acrylamido-2-methylpropanecarboxylic acid was substituted for the 2-acrylamido-2-methylpropanesulfonic acid to obtain a copolymer. Incidentally, the copolymerization proportion of 2-acrylamido-2-methylpropanecarboxylic acid/2,2,2-trifluoroethyl acrylate/β-(perfluorooctyl)ethyl acrylate of this copolymer was 10/55/35 (%). Subsequently, this copolymer was dissolved in an aqueous solution containing triethanolamine in a proportion of 4/5 mole per mole of the 2-acrylamido-2-methylpropanecarboxylic acid charged, to obtain a copolymer salt solution having a solid content of 10%. This copolymer salt is referred to hereinafter as Copolymer M. The Mn of Copolymer M was $5.5 \times 10^4$.

Formation of Reflection Preventing Film and Resist Pattern and Evaluation of Performances of Reflection Preventing Film Examples 1–27

Each of Copolymers A–M obtained in Synthesis Examples 1–13 was uniformly mixed with water [provided that in Example 19, a mixture of 100 parts of Copolymer D with 5 parts of triphenylsulfoniumtrifluoromethanesulfonate was used and in Examples 20 and 25, a mixture of 100 parts of the copolymer with 50 parts of F Top EF-204 (surface active agent) was used], to form an aqueous solution having a solid concentration of 4%, and the solution was filtered through a membrane filter having a pore diameter of 0.2 μm to prepare aqueous solutions of reflection preventing film materials. Using the aqueous solutions obtained, reflection preventing films were formed, and resist patterns were formed as mentioned above and the performances of the reflection preventing films were evaluated as mentioned above.

The evaluation results obtained are shown in Tables 1 and 2.

Comparative Examples 1–5

In the same manner as in the corresponding Examples, except that the reflection preventing films shown in Tables 1 and 2 were used, resist patterns were formed and the performances of the reflection preventing films were evaluated.

The evaluation results are shown in Tables 1 and 2.

TABLE 1

|  | Kind of reflection preventing film | Kind of resist | Resolution (μm) | Develop-ability | Pattern form | Standing wave effect | I M (*1) |
|---|---|---|---|---|---|---|---|
| Example |  |  |  |  |  |  |  |
| 1 | Copolymer A | A | 0.40 | Good | A | Small | No |
| 2 | Copolymer B | A | 0.40 | " | " | " | " |
| 3 | Copolymer C | A | 0.40 | " | " | " | " |
| 4 | Copolymer D | A | 0.40 | " | " | " | " |
| 5 | Copolymer E | A | 0.40 | " | " | " | " |
| 6 | Copolymer F | A | 0.40 | " | " | " | " |
| 7 | Copolymer G | A | 0.40 | " | " | " | " |
| 8 | Copolymer H | A | 0.40 | " | " | " | " |
| 9 | Copolymer I | A | 0.40 | " | " | " | " |
| 20 | Copolymer J (*3) | A | 0.40 | " | " | " | " |
| 21 | Copolymer K | A | 0.40 | " | " | " | " |
| 22 | Copolymer L | A | 0.40 | " | " | " | " |
| 26 | Copolymer M | A | 0.40 | " | " | " | " |
| Comparative Example |  |  |  |  |  |  |  |
| 1 | — | A | 0.40 | Good | A | Large | — |
| 2 | PVA (*2) | A | 0.40 | " | " | Middle | Yes |

Note:
*1: Intermixing
*2: Polyvinyl alcohol
*3: Surface active agent F Top EF-204 (50 parts by weight) was compounded with Copolymer J (100 parts by weight).

TABLE 2

|  | Kind of reflection preventing film | Kind of resist | Resolution (μm) | Develop-ability | Pattern form | Standing wave effect | I M (*1) |
|---|---|---|---|---|---|---|---|
| Example |  |  |  |  |  |  |  |
| 10 | Copolymer A | B | 0.34 | Good | A | Small | No |
| 11 | Copolymer B | B | 0.34 | " | A | " | " |
| 12 | Copolymer C | B | 0.34 | " | A | " | " |
| 13 | Copolymer D | B | 0.34 | " | B | " | " |
| 14 | Copolymer E | B | 0.34 | " | A | " | " |
| 15 | Copolymer F | B | 0.34 | " | B | " | " |
| 16 | Copolymer G | B | 0.34 | " | B | " | " |
| 17 | Copolymer H | B | 0.34 | " | B | " | " |
| 18 | Copolymer I | B | 0.34 | " | A | " | " |
| 19 | Copolymer D (*2) | B | 0.34 | " | A | " | " |
| 23 | Copolymer J | B | 0.34 | " | A | " | " |
| 24 | Copolymer K | B | 0.34 | " | A | " | " |
| 25 | Copolymer L (*5) | B | 0.34 | " | A | " | " |
| 27 | Copolymer M | B | 0.34 | " | A | " | " |
| Comparative Example |  |  |  |  |  |  |  |
| 3 | — | B | 0.34 | Good | B | Large | — |
| 4 | PEVE (*3) | B | 0.34 | Scum esist | D | Middle | Yes |
| 5 | PEVE (*4) | B | 0.36 | " | D | " | " |

Note:
*1: Intermixing
*2: Triphenylsulphoniumtrifluoromethanesulfonate (5 parts by weight) was compounded with Copolymer D (100 parts by weight).
*3: Polymethyl vinyl ether
*4: Polyethyl vinyl ether
*5: Surface active agent F Pop EF-204 (50 parts by weight) was compounded with Copolymer L (100 parts by weight).

What is claimed is:

1. A reflection preventing film comprising a copolymer, its salt or both of them, said copolymer having at least one recurring unit represented by formula (2) and at least one recurring unit represented by formula (3):

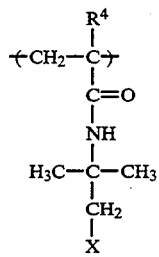

(2)

wherein $R^4$ represents a hydrogen atom or organic group and X represents a carboxyl group or a sulfo group,

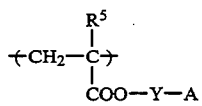

(3)

wherein $R^5$ represents a hydrogen atom or an organic group, A represents a fluoroalkyl group and Y represents an alkylene group or a fluoroalkylene group.

2. The reflection preventing film according to claim 1, wherein the organic group $R^4$ in formula (2) and the organic group $R^5$ in formula (3) are selected from the group consisting of alkyl groups having 1-10 carbon atoms, carboxyl group, carboxyalkyl groups having 2-10 carbon atoms, alkoxycarbonyl groups having 2-10 carbon atoms, acyloxy groups having 2-10 carbon atoms, aryl groups having 6-10 carbon atoms, aralkyl groups having 7-12 carbon atoms, alkoxy groups having 1-10 carbon atoms, cycloalkyl groups having 3-10 carbon atoms and cyano group.

3. The reflection preventing film according to claim 1, wherein in formula (3) the fluoroalkyl group of A is a hydrofluoroalkyl group or a perfluoroalkyl group, and the fluoroalkylene group of Y is a hydrofluoroalkylene group or a perfluoroalkylene group.

4. The reflection preventing film according to claim 1, wherein X in formula (2) is a carboxyl group and the recurring units represented by formula (2) are the residues of unsaturated carboxylic acid monomers.

5. The reflection preventing film according to claim 1, wherein X in formula (2) is a sulfo group and the recurring units represented by formula (2) are the residues of unsaturated sulfonic acid monomers.

6. The reflection preventing film according to claim 1, wherein the total amount of the recurring units represented by formula (2) is 5-99.9% by weight based on the total amount of the recurring units represented by formulas (2) and (3) and the amount of the recurring unit represented by formula (3) is 0.1-95% by weight based on the total amount of the recurring units represented by formulas (2) and (3).

7. The reflection preventing film according to claim 1, wherein the total amount of the recurring units represented by formula (2) is 7-80% by weight based on the total amount of the recurring units represented by formulas (2) and (3), and the amount of the recurring unit represented by formula (3) is 20-93% by weight based on the total amount of the recurring units represented by formulas (2) and (3).

8. The reflection preventing film according to claim 1, wherein the copolymer has further a recurring unit derived from a vinyl monomer other than formulas (2) and (3) or a diene monomer.

9. The reflection preventing film according to claim 8, wherein the vinyl monomer or diene monomer is selected from the group consisting of vinyl carboxylate compounds, vinyl cyanide compounds, unsaturated carboxylic acid ester compound, aromatic vinyl compounds, olefin halide compounds, diene compounds, epoxy-containing vinyl compounds, halogen-containing vinyl compounds, hydroxyl-containing vinyl compounds, amido-containing vinyl compounds and carboxyl-containing vinyl compounds.

10. The reflection preventing film according to claim 8, wherein the vinyl monomer other than formulas (2) and (3) or diene monomer is copolymerized in a proportion of 3-40% by weight of the total weight of the monomers.

11. The reflection preventing film according to claim 1, wherein the copolymer salt is a salt obtained by neutralizing a part or the whole of the carboxyl groups and/or sulfo groups of the copolymer.

12. The reflection preventing film according to claim 11, wherein the neutralization is effected with ammonia or an organic amine.

13. The reflection preventing film according to claim 1, wherein the polystyrene reduced average molecular weight of the copolymer or its salt is 1,000-1,000,000.

* * * * *